United States Patent
Shirakawa et al.

(10) Patent No.: US 8,254,082 B2
(45) Date of Patent: Aug. 28, 2012

(54) CAPACITOR MATERIAL, PRODUCTION METHOD OF THE SAME, AND CAPACITOR, WIRING BOARD AND ELECTRONIC DEVICE CONTAINING THAT MATERIAL

(75) Inventors: Akihiko Shirakawa, Chiba (JP); Ryuichi Mitsumoto, Chiba (JP); Koji Tokita, Ichihara-shi (JP)

(73) Assignee: Showa Denko K.K., Tokyo (JP)

( * ) Notice: Subject to any disclaimer, the term of this patent is extended or adjusted under 35 U.S.C. 154(b) by 723 days.

(21) Appl. No.: 12/374,698

(22) PCT Filed: Jan. 25, 2008

(86) PCT No.: PCT/JP2008/051110
§ 371 (c)(1),
(2), (4) Date: Jan. 22, 2009

(87) PCT Pub. No.: WO2008/090985
PCT Pub. Date: Jul. 31, 2008

(65) Prior Publication Data
US 2010/0014271 A1    Jan. 21, 2010

Related U.S. Application Data

(60) Provisional application No. 60/899,664, filed on Feb. 6, 2007.

(30) Foreign Application Priority Data

Jan. 26, 2007    (JP) .................................. 2007-016687

(51) Int. Cl.
*H01G 4/008*    (2006.01)

(52) U.S. Cl. ..................... 361/311; 361/303; 361/306.3; 361/302; 361/312

(58) Field of Classification Search ................. 361/303, 361/306.3, 302, 311, 312
See application file for complete search history.

(56) References Cited

U.S. PATENT DOCUMENTS

| | | | |
|---|---|---|---|
| 3,126,503 A | 3/1964 | Salomon | |
| 3,599,053 A | 8/1971 | Iida et al. | |
| 4,587,041 A | 5/1986 | Uedaira et al. | |
| 6,819,540 B2 * | 11/2004 | Allen et al. | 361/302 |
| 2002/0122283 A1 * | 9/2002 | Higashi et al. | 361/271 |

FOREIGN PATENT DOCUMENTS

| | | |
|---|---|---|
| CN | 1474422 A | 2/2004 |
| JP | 33-005816 | 7/1958 |
| JP | 42-024103 | 11/1967 |
| JP | 42-27011 | 12/1967 |
| JP | 43-002649 | 1/1968 |

(Continued)

OTHER PUBLICATIONS

"Phase Diagrams for Electronic Ceramics I: Dielectric Ti, Nb, and Ta Oxide Systems," Robert S. Roth, general editor, The American Ceramic Society, 2003, pp. 4-8.

(Continued)

*Primary Examiner* — Nguyen T Ha
*Assistant Examiner* — Hung Dang
(74) *Attorney, Agent, or Firm* — Sughrue Mion, PLLC (57) ABSTRACT

The capacitor material of the present invention is comprised by laminating a titanium dioxide layer and a titanate compound layer having perovskite crystals.

26 Claims, 6 Drawing Sheets

FOREIGN PATENT DOCUMENTS

| | | |
|---|---|---|
| JP | 54-001020 | 1/1979 |
| JP | 60-116119 A | 6/1985 |
| JP | 62-181415 A | 8/1987 |
| JP | 05-121275 | 5/1993 |
| JP | 06-049950 | 6/1994 |
| JP | 07-086075 A | 3/1995 |
| JP | 7086075(A) * | 3/1995 |
| JP | 11-80596 A | 3/1999 |
| JP | 11-172489 | 6/1999 |
| JP | 2000-173349 A | 6/2000 |

OTHER PUBLICATIONS

Gmelin's Handbook of Inorganic Chemistry, Titanium, 8th totally revised edition, System No. 41, 1951, Verlag Chemie, GmbH, pp. 221, 224, 225, and 251 with English translation (7 pages total).

* cited by examiner

CAPACITOR MATERIAL, PRODUCTION METHOD OF THE SAME, AND CAPACITOR, WIRING BOARD AND ELECTRONIC DEVICE CONTAINING THAT MATERIAL

The present application claims priority on the basis of Japanese Patent Application No. 2007-016687 filed in Japan on Jan. 26, 2007 and on U.S. Provisional Patent Application No. 60/899,664 filed in the US on Feb. 6, 2007, the contents of which are incorporated herein by reference.

TECHNICAL FIELD

The present invention relates to a capacitor material having a high withstand voltage and low leakage current, a production method of the same, and a capacitor, wiring board and electronic device containing that material.

BACKGROUND ART

Aluminum oxide, tantalum oxide and niobium oxide have conventionally been used as dielectrics of electrolytic capacitors. Although studies have long been conducted on capacitors using titanium dioxide, which have a larger specific dielectric constant than these oxides, for the dielectric (to also be referred to as "titanium capacitors"), these capacitors have not come into practical use due to the problem of large leakage current. A large leakage current is particularly fatal in recently popular metal electrodes effective for reducing impedance in the GHz region since restoration (reoxidation) of electrical leakage cannot be expected when an electrolyte or electrically conductive polymer is used for the cathode in the manner of an electrolytic capacitor.

The following describes previous attempts made to reduce leakage current of titanium capacitors.

It is described in Japanese Examined Patent Application, Second Publication No. S33-5816 (Patent Document 1) that, although a non-aqueous solvent is subjected to anodic oxidation for use as an electrolyte, "a product chemically converted in non-aqueous solvent deteriorates when transferred to an aqueous solution". Consequently, although not described in the publication, it is clear that a non-aqueous solvent having low electrical conductivity is used as an electrolyte. Perhaps because a non-aqueous solvent is used as an electrolyte, although the leakage current is low, dielectric loss tangent at 10 kHz is 10% or more in all cases.

U.S. Pat. No. 3,126,503 (Patent Document 2) indicates a method for obtaining an anodized film having superior electrical properties by using a titanium alloy containing vanadium, chromium and aluminum. However, the dielectric loss tangent thereof is 1.5% or more.

Japanese Examined Patent Application, Second Publication No. S42-27011 (Patent Document 3) states that a capacitor obtained by anodic oxidation of titanium has leakage current that is greater than that of tantalum or aluminum by two digits or more.

Although Patent Document 3 indicates a method for reducing leakage current by forming a passive layer with nitric acid solution as pretreatment of anodic oxidation, the dielectric loss tangent of the resulting sample is 1.5% or more.

The same inventor as that of Patent Document 3 indicates in Japanese Examined Patent Application, Second Publication No. S42-24103 (Patent Document 4) that the addition of tungsten or molybdenum to titanium reduces leakage current to about one-half that of the case of non-addition. However, even through leakage current is improved by one-half, this is still not adequate for practical use.

Japanese Examined Patent Application, Second Publication No. S43-2649 (Patent Document 5) indicates that leakage current and loss can be reduced by containing barium peroxide or strontium peroxide in a molten salt of sodium nitrite and anodizing at a temperature of 280 to 350° C. However, the dielectric loss tangent at this time is 2.8% or more.

Japanese Examined Patent Application, Second Publication No. S54-1020 (Patent Document 6) indicates that leakage current is reduced by using an alloy containing 20 to 30 atomic percent of aluminum in titanium. However, measurement of electrical properties is carried out in an electrolyte. Typically in electrostatic capacitors, an electrical leakage portion is known to be reanodized and insulated (repair effects) when a direct current voltage is applied in an electrolyte or electrically conductive polymer and the like. Thus, it is presumed that the leakage current decreased due to repair effects in this measurement.

Japanese Unexamined Patent Application, First Publication No. H5-121275 (Patent Document 7) indicates a method for obtaining a capacitor having a satisfactory dielectric loss tangent by adjusting anodic oxidation conditions and carrying out heat treatment thereafter. Since electrical properties are measured using an electrolyte having repair capabilities in this case as well, this is similar to the Patent Document 6 described above.

Moreover, the following lists examples of obtaining a dielectric by forming a compound such as barium titanate on a titanium base material.

Japanese Examined Patent Application, Second Publication No. H6-49950 (Patent Document 8) indicates size reduction of a capacitor by forming $Ba_{1-x}Sr_xTiO_3$ on titanium. Although $Ba_{1-x}Sr_xTiO_3$ is shown to be formed by X-ray diffraction, titanium oxide is not confirmed.

Japanese Unexamined Patent Application, First Publication No. H7-86075 (Patent Document 9) indicates a capacitor having a titanium oxide layer and a composite titanium oxide layer on a titanium surface. It is described therein that a titanium oxide thin film is formed at the interface between titanium and barium titanate when a titanium metal substrate, in which a barium titanate thin film is formed on the surface thereof, is fired for 1 hour in air at 700° C. However, an insulating titanium oxide thin film capable of being used as a capacitor cannot be obtained under such firing conditions. This is indicated in, for example, a phase diagram relating to thermal oxidation of titanium in "Phase Diagrams for Electronic Ceramics I: Dielectric Ti, Nb and Ta Oxide Systems" (The American Ceramic Society, pp. 4-8 (Non-Patent Document 1)). Furthermore, insulating titanium oxide refers to titanium dioxide ($TiO_2$). For example, the specific resistance values of various titanium oxides are indicated in Gmelins™ Handbuch Der Anorganischien Chemie Titan", 1951 Verlag Chemie, GmbH (Non-Patent Document 2). Namely, if titanium remains even after firing at 700° C. in an air atmosphere, TiO will also certainly remain as will $Ti_2O_3$. Thus, the reason for the improvement of insulating properties in Patent Document 9 is presumed to be due to the barium titanate thin film having been oxidized resulting in a decrease or crystallization of those portions serving as oxygen vacancies.

Figure 1:
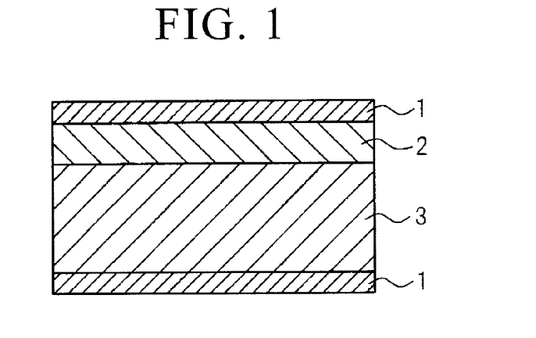
FIG. 1 is a schematic drawing showing one aspect of a capacitor using the capacitor material of the present invention.

Japanese Unexamined Patent Application, First Publication No. H11-172489 (Patent Document 10) indicates a method for forming a barium titanate film by first forming titanium oxide on a substrate followed by anodizing in a barium aqueous solution. In this method, however, the titanium oxide layer was determined to be extinguished by the reaction as shown in FIG. 1.

[Patent Document 1] Japanese Examined Patent Application, Second Publication No. S33-5816
[Patent Document 2] U.S. Pat. No. 3,126,503
[Patent Document 3] Japanese Examined Patent Application, Second Publication No. S42-27011
[Patent Document 4] Japanese Examined Patent Application, Second Publication No. S42-24103
[Patent Document 5] Japanese Examined Patent Application, Second Publication No. S43-2649
[Patent Document 6] Japanese Examined Patent Application, Second Publication No. S54-1020
[Patent Document 7] Japanese Unexamined Patent Application, First Publication No. H5-121275
[Patent Document 8] Japanese Examined Patent Application, Second Publication No. H6-49950
[Patent Document 9] Japanese Unexamined Patent Application, First Publication No. H7-86075
[Patent Document 10] Japanese Unexamined Patent Application, First Publication No. H11-172489
[Non-Patent Document 1] "Phase Diagrams for Electronic Ceramics I: Dielectric Ti, Nb and Ta Oxide Systems" (The American Ceramic Society, pp. 4-8
[Non-Patent Document 2] Gmelins™ Handbuch Der Anorganischien Chemie Titan" (1951) Verlag Chemie, GmbH

DISCLOSURE OF THE INVENTION

Problems to be Solved by the Invention

An object of the present invention is to resolve the problems of titanium capacitors as described above and provide a material allowing the obtaining of a titanium capacitor having low leakage current and low dielectric loss tangent (tan δ) without repair, a titanium capacitor and applications thereof (such as an in-board capacitor).

Means for Solving the Problems

The present invention provides the following inventions to solve the above-mentioned problems:
(1) a capacitor material comprising: lamination of a titanium dioxide layer and a titanate compound layer having perovskite crystals;
(2) the capacitor material described in (1) above, wherein an insulating material layer is further laminated on the titanium dioxide layer or the titanate compound layer;
(3) the capacitor material described in (2) above, wherein the insulating material is titanium dioxide or a titanate compound having perovskite crystals;
(4) the capacitor material described in any of (1) to (3) above, wherein the titanate compound is a compound with at least one type of element selected from the group consisting of Ca, Sr and Ba;
(5) the capacitor material described in any of (1) to (3) above, wherein the titanium dioxide layer and the titanate compound layer are laminated on a substrate;
(6) the capacitor material described in (5) above, wherein the substrate is an electrode;
(7) the capacitor material described in (5) or (6) above, wherein the substrate is titanium or an alloy containing titanium;
(8) the capacitor material described in any of (5) to (7) above, wherein the substrate is a foil;
(9) the capacitor material described in (8) above, wherein the thickness of the foil is 5 to 300 µm;
(10) the capacitor material described in any of (5) to (7) above, wherein the substrate is a sintered body of titanium or an alloy containing titanium;
(11) the capacitor material described in (10) above, wherein the sintered body is a sintered body of particles having a particle diameter of 0.1 to 20 µm;
(12) a capacitor comprising: arranging the titanium dioxide layer and the titanate compound layer of the capacitor materials described in any of (1) to (11) above so as to be electrically in series between a pair of electrodes;
(13) the capacitor described in (12) above, wherein the product of capacitance density and dielectric breakdown voltage at a measuring frequency of 1 MHz is 300 nF·V/cm$^2$ or more;
(14) the capacitor described in (12) or (13) above, wherein the dielectric loss tangent at a measuring frequency of 1 kHz is 0.03 or less;
(15) the capacitor described in any of (12) to (14) above, wherein the electrostatic capacitance at a measuring frequency of 1 MHz is 80% or more of the electrostatic capacitance at a measuring frequency of 100 Hz;
(16) a wiring board containing the capacitor described in any of (12) to (15) above;
(17) an electronic device containing the capacitor described in any of (12) to (15) above;
(18) a production method of a capacitor material comprising: a step for laminating a titanium dioxide layer and a titanate compound layer having perovskite crystals;
(19) the production method of a capacitor material described in (18) above, wherein the lamination is carried out on a substrate;
(20) the production method of a capacitor material described in (19) above, wherein the substrate is titanium or a metal containing titanium, and the titanium dioxide layer is formed by anodizing the substrate;
(21) the production method of a capacitor material described in (20) above, wherein the substrate is anodized after removing a natural oxidization coating from the substrate surface;
(22) the production method of a capacitor material described in any of (18) to (21) above, wherein the titanate compound layer having perovskite crystals is laminated by reacting an aqueous solution of pH 11 or higher containing at least one type of metal ion selected from the group consisting of Ca, Sr and Ba with the titanium dioxide layer at a temperature range of 80° C. to the boiling point;
(23) the production method of a capacitor material described in (22) above, comprising a step for drying the capacitor material following the reaction, and the aqueous solution containing at least one type of metal ion selected from the group consisting of Ca, Sr and Ba is vaporized by at least one means from among evaporation, sublimation and thermal decomposition at a temperature equal to or lower than the drying temperature and under atmospheric pressure or reduced pressure;
(24) the production method of a capacitor material described in any of (18) to (23) above, further having a step for laminating an insulating material layer on the titanium dioxide layer or the titanate compound layer;
(25) the production method of a capacitor material described in (24) above, wherein the insulating material is titanium dioxide or a titanate compound having perovskite crystals;
(26) a capacitor production method having a step for producing a capacitor material using the production method described in any of (18) to (25) above, and a step for forming a pair of electrodes so as to be electrically in series with respect to the titanium dioxide layer and titanate compound layer of the capacitor material; and, (27) a capacitor production method having a step for producing a capacitor material using the production method described in any of (19) to (21) above, and a step for using the substrate of the capacitor material as one electrode and further laminating a counter electrode layer during lamination of the capacitor material.

Effects of the Invention

Figure 2:
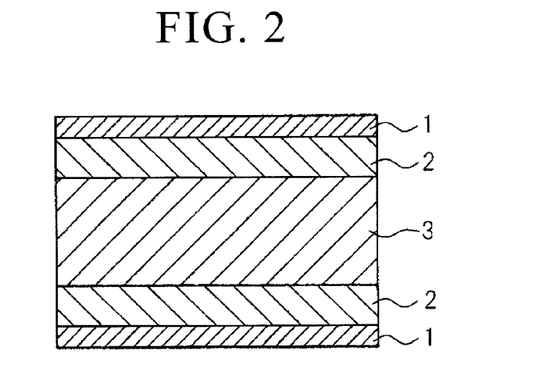
FIG. 2 is a schematic drawing showing one aspect of a capacitor using the capacitor material of the present invention.
Figure 3:
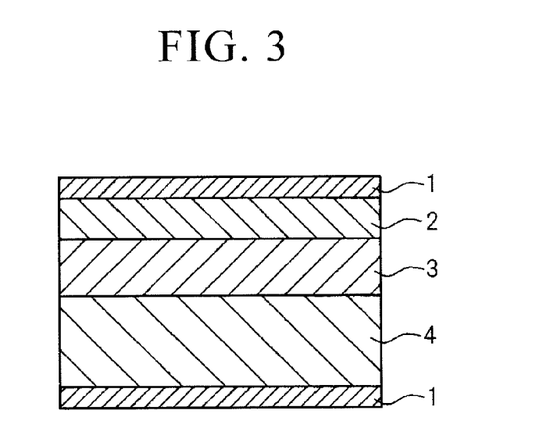
FIG. 3 is a schematic drawing showing one aspect of a capacitor using the capacitor material of the present invention.
Figure 4:
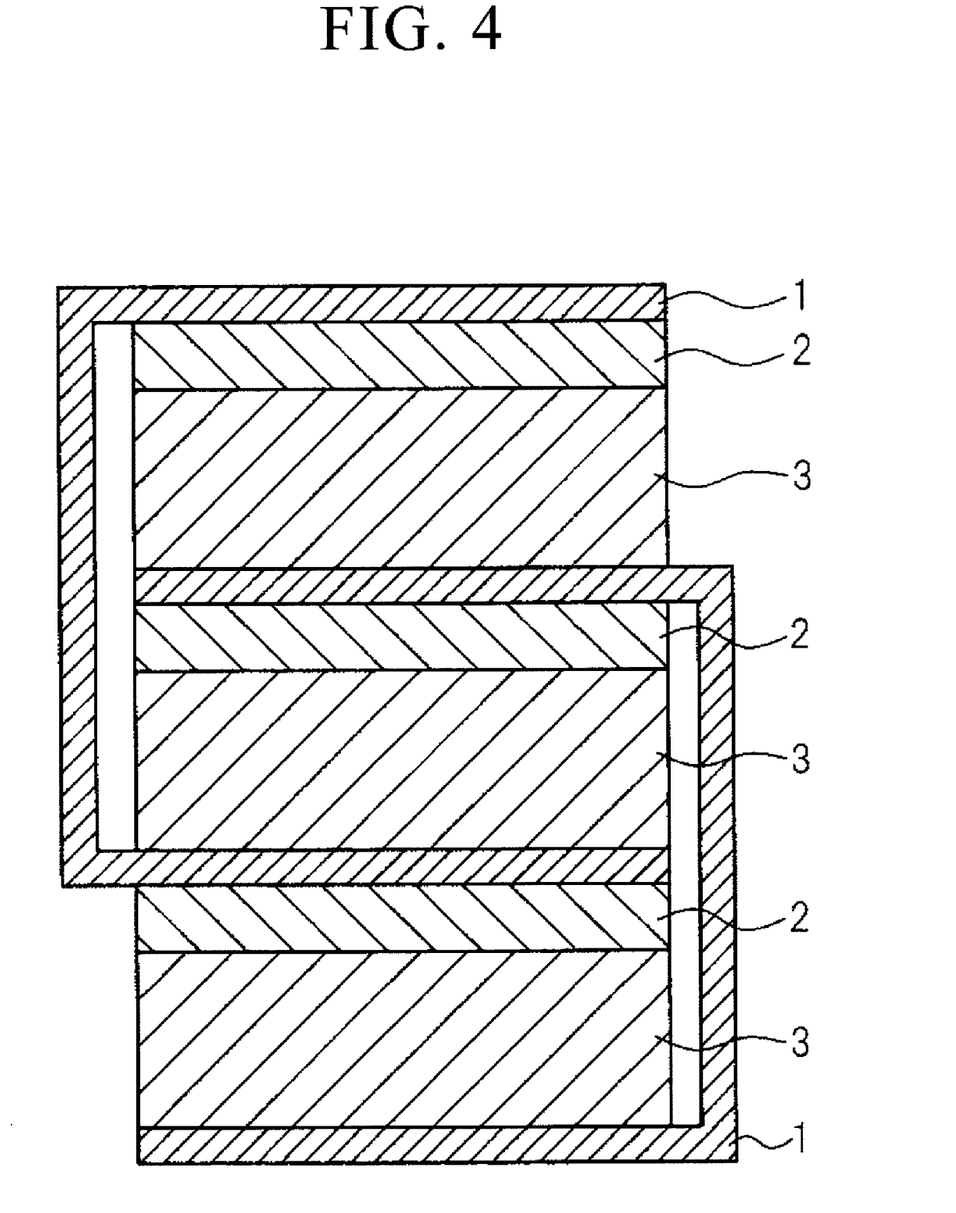
FIG. 4 is a schematic drawing showing one aspect of a capacitor using the capacitor material of the present invention.

According to the present invention, by laminating a titanium dioxide layer and a titanate compound layer having perovskite crystals, a capacitor material can be obtained in which a capacitor having high withstand voltage and low leakage current, unable to be obtained with either layer alone, can be obtained. If the thickness of an insulating material is reduced in one layer only, dielectric breakdown occurs or leakage current increases. In contrast, in the present invention, by laminating (arranging electrically in series) a titanium dioxide having high withstand voltage and an insulator having low leakage current, it was found that an insulating material is obtained having high withstand voltage and low leakage current. As shown in FIG. 1, for example, this material (reference symbol 2 indicates the titanate compound layer having perovskite crystals, while reference symbol 3 indicates the titanium dioxide layer) can be favorably used as a capacitor by forming electrodes 1 on this material. In addition, as shown in FIG. 2, two or more of the same insulating material layers can be used, or as shown in FIG. 3, three or more types of insulating materials can be used (reference symbol 4 indicates another insulating layer). In addition, as shown in FIG. 4, capacitance can be increased by laminating the materials shown in FIGS. 1 to 3 in parallel. It is desirable that the thickness including the electrodes be as thin as possible with respect to compact size and increased functional sophistication of the device, and is preferably set to a thickness of 200 μm or less. A thickness if 100 μm or less is even more preferable since it facilitates formation of a capacitor within a wiring board. Although the voltage at which dielectric breakdown occurs becomes lower then the thickness of the electrical insulating material decreases, the capacitance of the capacitor increases. Consequently, the thicknesses of various electrical insulating materials are determined based on the desired withstand voltage and capacitance of the capacitor. In the method of the present invention, a titanium dioxide layer of a prescribed thickness is formed in advance, and metal ions are reacted with a portion of this titanium dioxide layer. Thus, a titanate compound layer having a perovskite crystal structure can be formed on the titanium dioxide layer by an extremely easy method. Consequently, a capacitor material can be produced at low cost without requiring the use of complex and elaborate equipment. Desired layer thicknesses can be obtained since there is a correlation between the thickness of the titanium dioxide layer formed in advance and the titanate compound layer obtained following the reaction based on the materials used and the production conditions.

The formation of these layers facilitates easier handling if carried out on a substrate. An electrically conductive material can be used for the substrate, and the substrate can be used directly as an electrode when forming the capacitor. In addition, an insulating material can be used for the substrate and it may also be used directly as an insulating layer (see, for example, reference symbol 4 in FIG. 3).

In particular, if metal titanium or an alloy containing titanium is used for the substrate and a titanium dioxide layer is formed on the surface thereof by, for example, anodizing the substrate, the thickness of the titanium dioxide layer can be easily controlled. A titanate compound layer having a perovskite crystal structure can be formed on the titanium dioxide layer by reacting an aqueous solution containing at least one type of metal ion selected from the group consisting of Ca, Sr and Ba with the titanium dioxide layer.

Here, the use of an alkaline aqueous solution of pH 11 or higher for the solution containing Ca, Sr or Ba ions enables the formation of a titanate compound layer having a perovskite crystal structure having few defects, thereby allowing the obtaining of a capacitor having low dielectric loss tangent. If a basic compound that becomes a gas by at least one means from among evaporation, sublimation and thermal decomposition under atmospheric pressure or reduced pressure is used for the alkaline component of this alkaline solution, decreases in electrical properties of the capacitor caused by alkaline components remaining in the titanate compound layer can be inhibited, thereby allowing the obtaining of a capacitor having stable properties. In addition, the use of reaction temperature of 80° C. or higher allows the reaction to proceed more reliably. Although a higher reaction temperature is preferable in terms of the reaction proceeding, if a hydrothermal reaction occurs in a pressurized container due to reacting at a temperature equal to or higher than the boiling point of the aqueous solution, an insulator having a bilayer structure is not formed, thereby preventing the formation of a titanate compound layer having a perovskite crystal structure that extends to the interface with the base material.

A capacitor material obtained in this manner, in which a titanium dioxide layer and a titanate compound layer having a perovskite crystal structure are laminated, has high capacitance density. A capacitor produced with this material has a configuration in which a titanium dioxide layer and a titanate compound layer having perovskite crystals are arranged electrically in series between two electrodes. Consequently, in the case of a capacitor having only the two layers as dielectrics, the capacitance thereof is determined nearly entirely by the titanium dioxide layer having the lower dielectric constant. Consequently, as a result of using a titanate compound layer having a perovskite crystal structure and high dielectric constant, even if, for example, barium titanate, which exhibits capacitance properties highly dependent on temperature and current bias voltage, is used, the effects thereof can be suppressed to a low level. In addition, metal electrodes, for example, can be formed directly without using electrodes in which an electrolyte, electrically conductive polymer or other dielectric film can be reoxidized due to low leakage current. As a result, high-frequency properties are improved, and the capacitor obtained in the present invention normally has an electrostatic capacitance at 1 MHz of 80% or more of that at 100 Hz. In addition, reduced material thickness and process simplification can be expected since there is no need to use an electrolyte, electrically conductive polymer or carbon paste and the like. Thus, the capacitor obtained in the present invention is preferable for use as a capacitor or other electronic component, and allows reduced size of electronic components as well as reduced size and weight of electronic devices containing these electronic components.

BRIEF DESCRIPTION OF THE REFERENCE SYMBOLS

1 Electrode
2 Titanate compound layer containing perovskite crystals
3 Titanium dioxide layer
4 Insulating layer

BEST MODE FOR CARRYING OUT THE INVENTION

First, a detailed explanation is provided of the production method of the capacitor material of the present invention. The material of the present invention is obtained by a production method comprising a step for forming a titanium dioxide layer on a substrate surface, and a step for laminating a titanate compound layer having perovskite crystals on the titanium dioxide layer by reacting a solution containing at least one type of ion selected from the group consisting of Ca, Sr and Ba ions on the titanium dioxide layer. There are no particular limitations on the material of the substrate, and an electrical conductor, semiconductor or insulator can be used according to the application. A preferable example of a material for capacitor applications is an electrical conductor in the form of titanium metal or an alloy containing titanium. A metal substrate can be used as is as a capacitor electrode by forming an electrical conductor layer in the form of a titanium dioxide layer on any of these metal substrates. There are no particular limitations on the shape of the substrate, and that in the form of a plate or foil, or that not having a smooth surface, can be applied. Foil is preferable for capacitor applications from the viewpoint of compact size and light weight as well as from the viewpoint that the larger the surface area per unit weight of the substrate, the greater the ratio of the titanium dioxide layer to the substrate, thereby making this advantageous, and the thickness of the foil is preferably 5 to 300 µm, more preferably 5 to 100 µm and even more preferably 5 to 30 µm. When using foil for the substrate, surface area can be increased by forming irregularities in the surface thereof in advance by carrying out chemical etching using hydrofluoric acid or electrolytic etching and the like. Similarly, a sintered body containing microparticles of metal titanium or titanium alloy having a mean particle diameter of 0.1 to 20 µm, and preferably a sintered body containing microparticles of metal titanium or titanium alloy having a mean particle diameter of 1 to 10 µm, can be used as a substrate in order to increase the ratio of the titanate compound layer to the substrate.

A titanium dioxide layer of a prescribed thickness is formed on this substrate surface. The crystal structure of the titanium dioxide may be of the rutile, anatase or brookite type. There are no particular limitations on the method used to form the titanium dioxide layer. For example, although a dry process such as sputtering or plasma vapor deposition can be used, from the viewpoint of reducing production costs, the titanium dioxide layer is preferably formed using a wet process such as a sol-gel method or LPD. Alternatively, the titanium dioxide layer can also be formed by natural oxidation, thermal oxidation or anodic oxidation of the substrate surface, and anodic oxidation, or anodization, is particularly preferable in terms of being able to easily control layer thickness according to the voltage. A preferable example of a substrate is that comprised of titanium metal or an alloy containing titanium. The thickness of the titanium dioxide layer can be suitably adjusted according to the desired thickness of the tannic acid compound layer, and is normally adjusted to within the range of 1 nm to 4000 nm.

In anodic oxidation treatment, chemical conversion is carried out at a prescribed voltage and current density by immersing a partial region of a substrate comprised of titanium or titanium-containing alloy in a chemical conversion solution. At that time, it is preferable to carry out chemical conversion by coating the substrate with a masking material at a prescribed location to avoid the effects of fluctuations in the liquid level when immersed in the chemical conversion solution. A heat-resistant resin can typically be used for the masking material, and preferable examples thereof include, but are not limited to, a heat-resistant resin or derivative thereof capable of dissolving or swelling in a solvent, and a composition comprised of an inorganic fine powder or cellulose-based resin (Japanese Unexamined Patent Application, First Publication No. H11-80596).

During anodic oxidation treatment, treatment is preferably carried out after first removing as much of the natural oxidation coating as possible from the substrate surface. In this case, since the titanium dioxide layer is formed comprised nearly entirely of titanium oxide formed by anodic oxidation treatment, the layer thickness, uniformity and so forth of the titanium oxide layer are easily controlled, thereby resulting in improved reproducibility. Furthermore, the natural oxidation coating on the substrate surface can be removed by etching with hydrofluoric acid and the like.

Conditions of anodic oxidation treatment consist of using an electrolyte of an acid and/or salt thereof, such as an electrolyte containing at least one type of acid selected from the group consisting of phosphoric acid, sulfuric acid, oxalic acid, boric acid and adipic acid as well as salts thereof, an electrolyte concentration of 0.1 to 30% by weight, a temperature of 0 to 90° C., a current density of 0.1 to 1000 mA/cm$^2$, a voltage of 2 to 400 V, a duration of 1 msec to 400 min, carrying out constant-current anodic oxidation using a valve metal for the anode, and carrying out constant-voltage anodic oxidation after having reached a predetermined voltage. More preferably, conditions are preferably selected consisting of an electrolyte concentration of 1 to 20% by weight, temperature of 20 to 80° C., current density of 1 to 400 mA/cm$^2$, voltage of 5 to 90 V, and duration of 1 sec to 300 min.

Next, a solution containing at least one type of ion selected from the group consisting of Ca, Sr and Ba ions is reacted with the titanium dioxide layer formed according to the method described above. As a result of this reaction, a titanate compound layer with an element of the above ions having a perovskite structure can be formed on the titanium dioxide layer.

An aqueous solution of a hydroxide, nitrate, acetate or chloride and the like of Ca, Sr or Ba can be used for the solution containing at least one type of ion selected from the group consisting of Ca, Sr and Ba ions. In addition, one type of these metal compounds may be used alone, or two or more types may be used by mixing in an arbitrary ratio. Specific examples of compounds that can be used include calcium chloride, calcium nitrate, calcium acetate, strontium chloride, strontium nitrate, barium hydroxide, barium chloride, barium nitrate and barium acetate.

The conditions of this reaction are such that the reaction is carried out in an alkaline solution in which a basic compound is present. The pH of the solution is preferably 11 or higher, more preferably 13 or higher and particularly preferably 14 or higher. The use of a high pH makes it possible to produce a titanate compound layer having a perovskite crystal structure with fewer defects. A layer having few defects is preferable for reducing the dielectric loss tangent. The reaction solution is preferably maintained at an alkalinity of pH 11 or higher by adding an organic base compound. There are no particular limitations on the basic component added, and a substance is preferable that forms a gas by evaporation, sublimation and/or thermal decomposition at the drying temperature or lower and under atmospheric pressure or reduced pressure, examples of which that can be used preferably including organic basic compounds such as tetramethyl ammonium hydroxide (TMAH) or choline. The addition of an alkali metal hydroxide such as lithium hydroxide, sodium hydroxide or potassium hydroxide causes the alkali metal to remain in the resulting titanate compound layer having perovskite crystals, thereby resulting in the possibility of inferior properties as a functional material such as a dielectric material or capacitor when in the form of a finished product. Consequently, it is preferable to use tetramethyl ammonium hydroxide or other organic basic compound as described above.

The amount of each Ca, Sr or Ba metal ion in the solution is preferably adjusted so as to be in excess with respect to the amount consumed by formation of the tannic acid compound layer. For example, the amount of each metal ion is 3 mmol or more per 1 $cm^2$ of surface area over which the titanate compound layer is formed. Moreover, a compound containing at least one element selected from the group consisting of Sn, Zr, La, Ce, Mg, Bi, Ni, Al, Si, Zn, B, Nb, W, Mn, Fe, Cu and Dy may be added to the solution so that these elements are contained in the tannic acid compound layer following reaction in order to adjust the electrical properties of the capacitor produced.

An alkaline solution prepared in this manner is normally reacted by heating and maintaining at a temperature from 80° C. to the boiling point of the solution under normal pressure while stirring. The reaction time is normally 10 minutes or more and preferably 1 hour or more. The resulting sample may be removed of impurity ions using a method such as dialysis, ion exchange or water rinsing and the like as necessary. Insoluble carbonates of Ca, Sr or Ba may be formed if the reaction is carried out in air. In the case it is difficult to remove such carbonate impurities from the sample surface using the methods described above, impurity ions are preferably removed after first dissolving and removing insoluble carbonates by acid washing. Next, the sample is dried. Drying is normally carried out at a temperature of room temperature to 150° C. for 1 to 24 hours. There are no particular limitations on the drying atmosphere, and drying can be carried out in air or under reduced pressure.

As has been described above, a capacitor can be fabricated having as one of the electrodes thereof a metal substrate formed by the material of the present invention. At this time, a capacitor can be fabricated having as the other electrode thereof (the counter electrode of the first electrode) a metal such as copper, nickel, platinum, palladium or aluminum. Among these metals, copper is the most preferable.

A capacitor obtained in this manner allows the thickness of the dielectric layer to be reduced, thereby making it possible to reduce the size of the capacitor itself. In addition, as a result of reducing the thickness of the dielectric layer, the electrostatic capacitance of the capacitor can be further increased.

In the capacitor of the present invention, the product of capacitance density and dielectric breakdown voltage at a measuring frequency of 1 MHz is normally 300 nF·V/$cm^2$ or more (and, for example, the capacitance density is 150 nF·V/$cm^2$ or more if the dielectric breakdown voltage is 2 V when applying a direct current voltage), the dielectric loss tangent at a measuring frequency of 1 kHz is 0.03 or less, and the electrostatic capacitance at a measuring frequency of 1 MHz is 80% or more of the electrostatic capacitance at a measuring frequency of 100 Hz.

Moreover, in the present invention, a capacitor can be obtained in which the product of capacitance density and dielectric breakdown voltage at a measuring frequency of 1 kHz is 1000 nF·V/$cm^2$ or more, the dielectric loss tangent at a measuring frequency of 1 kHz is 0.013 or less, or the electrostatic capacitance at a measuring frequency of 1 MHz is 90% or more of the electrostatic capacitance at a measuring frequency of 100 Hz.

This type of compact capacitor can be preferably used as a component of wiring boards and electronic devices, and particularly as a component of cell phones and other portable devices. The mounting thereof can be in accordance with ordinary methods.

EXAMPLES

Although the following provides a detailed explanation of the present invention by listing examples and comparative examples thereof, the present invention is not limited to these examples.

Example 1

Figure 5:
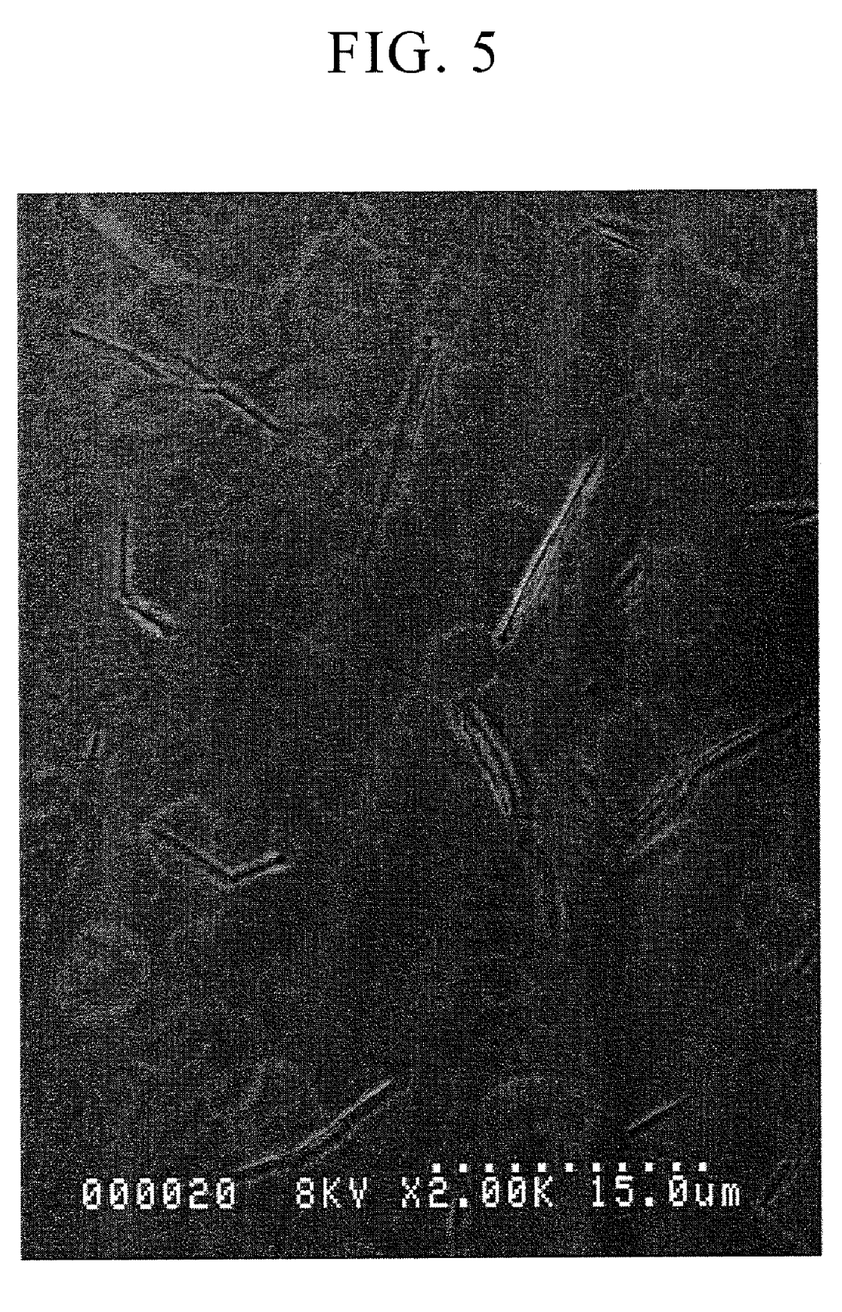
FIG. 5 is an SEM micrograph of the surface of titanium substrate anodized in Example 1.
Figure 6:
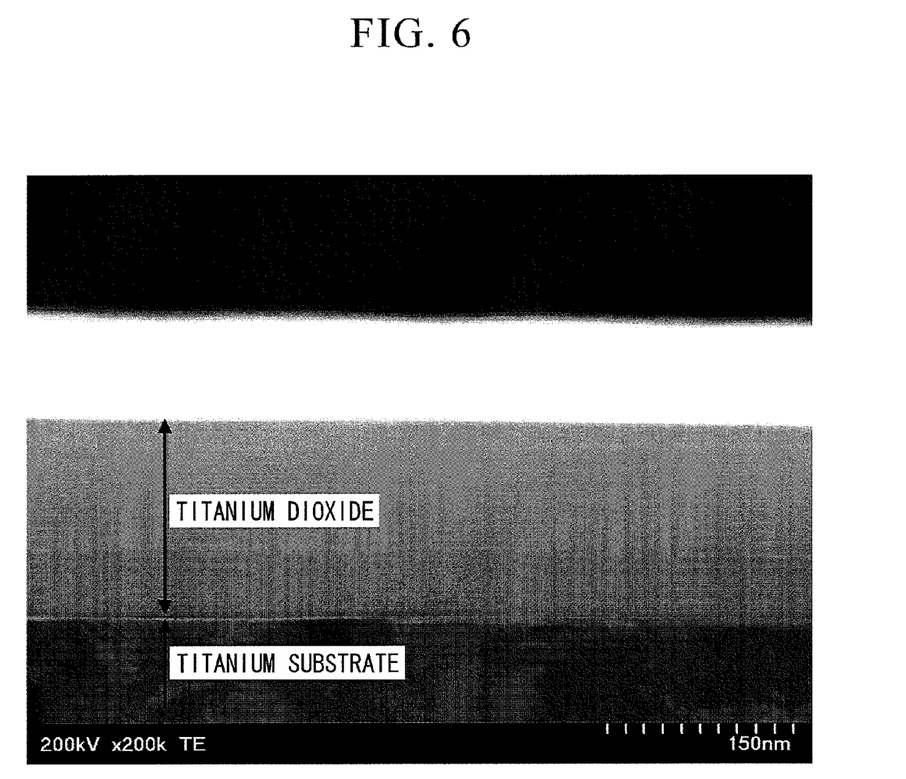
FIG. 6 is a TEM micrograph of a cross-section of a titanium substrate anodized in Example 1.
Figure 7:
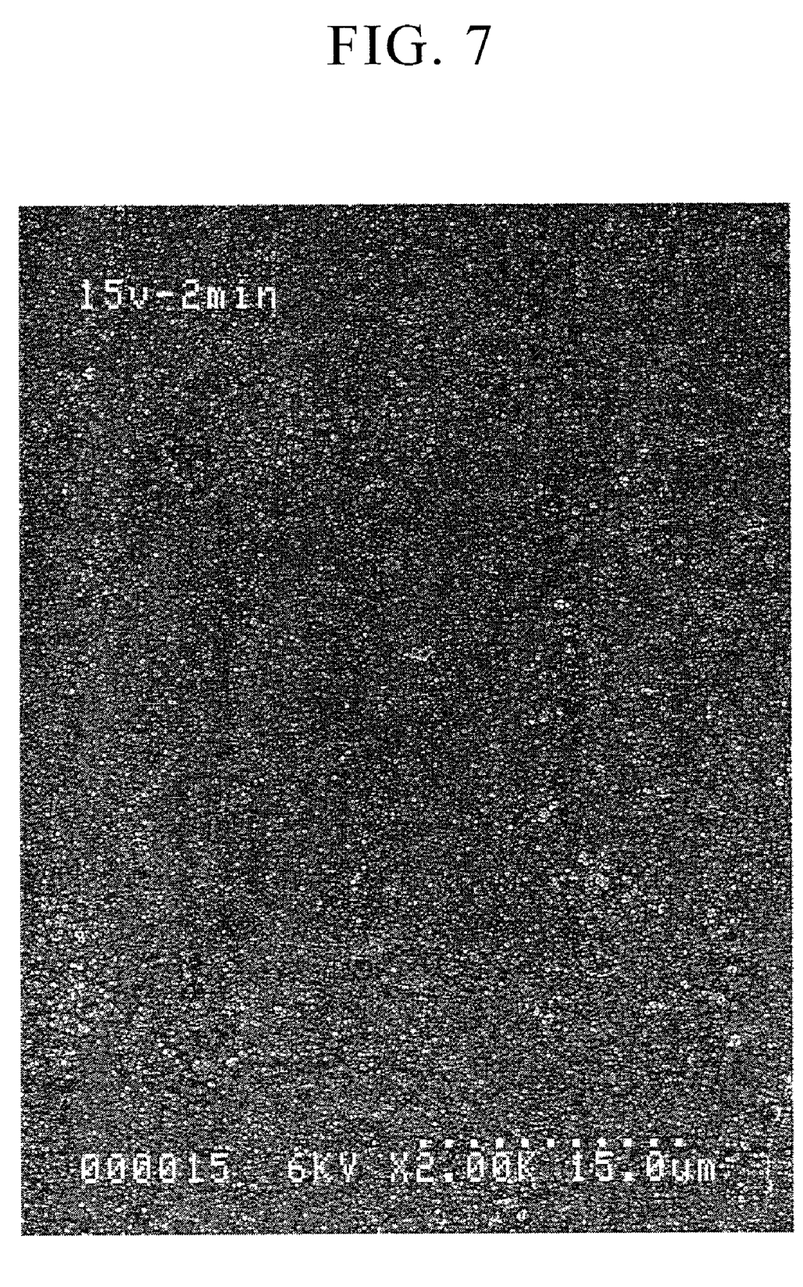
FIG. 7 is an SEM micrograph of a barium titanate layer formed on a titanium substrate anodized in Example 1.
Figure 8:
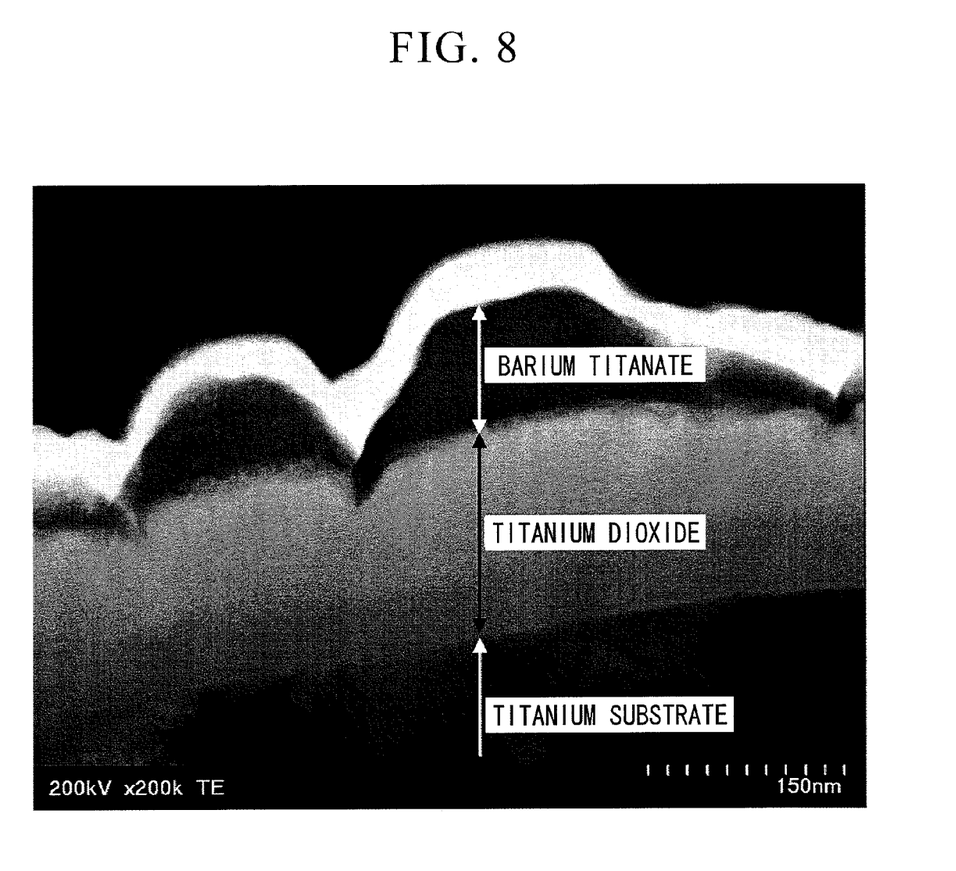
FIG. 8 is a TEM micrograph of a cross-section of a titanium dioxide layer and a barium titanate layer laminated on a titanium substrate in Example 1.

Foil obtained by etching titanium foil having a thickness of 50 μm and purity of 99.9% (Thank Metal Co., Ltd.) was etched with hydrofluoric acid to a thickness of 40 μm for use as a substrate. A masking material was coated onto one side of the resulting foil. An electrode terminal for anodic oxidation was fixed to one side of this piece of foil. A portion 10 $cm^2$ from the edge of the other end of the titanium foil on the opposite side from the fixed side was anodized at a constant current to a voltage of 60 V at a current density of 30 mA/$cm^2$ in a 5% by weight aqueous phosphoric acid solution at a temperature of 20° C. After the voltage reached 60 V, anodic oxidation treatment was carried out at a constant voltage until 10 minutes after the start of anodic oxidation. Next, anodized sample was rinsed with water and dried. The sample surface was found to be smooth when observed with a scanning electron microscope (SEM) (FIG. 5). In addition, when the cross-sectional structure cut out with an FIB device was investigated with a transmission electron microscope (TEM), a titanium dioxide layer was found to be formed having a thickness of about 140 nm (FIG. 6). Next, the sample was allowed to react by immersing for 4 hours in a solution in which 10 g of barium hydroxide octahydrate (Optronics Co., Ltd.) were dissolved in 1 L of a 20% aqueous solution of tetramethyl ammonium hydroxide (Sachem Showa Co., Ltd.) at the boiling point (in this case, 104° C.) and under atmospheric pressure. After removing the sample from the reaction solution, immersing in 0.1 N nitric acid to dissolve and remove adhered barium carbonate and rinsing with water, the sample was dried at 150° C. When the sample surface was observed with an SEM, although granular surface irregularities were observed, there were no foreign objects observed that appeared to be adhered to the surface (FIG. 7). When identified by X-ray diffraction, in addition to diffraction peaks of the titanium of the substrate and the titanium dioxide formed during anodic oxidation, since a diffraction peak was also observed for a cubic perovskite structure in the form of barium titanate, cubic barium titanate was determined to have been formed. The thickness of the barium titanate layer was determined to be such that the portion having an average thickness of about 20 nm on the surface of the titanium dioxide layer was barium titanate based on TEM observation of a cross-section of the sample obtained with an FIB device (FIG. 8). Next, after carefully peeling off the masking material from the titanium foil, the sample was cut to a size of 30 mm×30 mm. Copper was then laminated to a thickness of 200 nm by electron beam deposition using a mask having an opening measuring 10 mm×10 mm in the surface of the sample where the barium titanate was formed. The thickness of the resulting entire sample, including the titanium substrate, was 41 µm. The titanium foil serving as the substrate was used for the other electrode and electrostatic capacitance was measured under the conditions indicated below.

Apparatus: LF Impedance Analyzer (Model 4192A, Agilent Technologies Inc.)
Measuring frequency: 1 kHz
Amplitude: 1 V As a result, a large value of 212 nF was obtained for electrostatic capacitance. Since the electrode surface area is 1 $cm^2$, capacitance density becomes 212 $nF/cm^2$. tan δ was extremely low at 0.003.

The sample was connected in series with a 1 MΩ resistor, and a direct current voltage of 1 V was applied to the sample and the 1 MΩ resistor so that the titanium foil side was the positive electrode. The voltage applied to both ends of the 1 MΩ resistor was measured 30 seconds after applying the voltage and the direct current resistance of the sample was calculated from that value. As a result, the direct current resistance was 1.4 GΩ.

With respect to dielectric breakdown voltage, a direct current applied voltage was increased in 0.1 V increments starting at 1 V using the same measuring circuit as that used during the previously described measurement of direct current resistance. After applying each voltage for 30 seconds, the applied voltage was returned to 1 V and direct current resistance was measured 30 seconds later. The applied voltage when the resistance at that time had decreased to less than 1 MΩ was taken to be the dielectric breakdown voltage. As a result, the dielectric breakdown voltage was 6.4 V.

A similarly prepared sample was laminated between two glass epoxy copper-clad laminates (FR-4) measuring 100 mm×100 mm. When electrostatic capacitance was measured with the LF Impedance Analyzer while in this state, electrostatic capacitance was 216 nF at a measuring frequency of 100 Hz, 213 nF at a measuring frequency of 1 kHz and 199 nF at a measuring frequency of 1 MHz. Thus, the electrostatic capacitance at a measuring frequency of 1 MHz was 92.1% of that at a measuring frequency of 100 Hz, thereby demonstrating extremely little frequency dependency and indicating the sample to be optimal for use in a wiring board or electronic device such as a high-frequency module.

Example 2

An experiment was conducted in exactly the same manner as Example 1 with the exception of using an anodic oxidation voltage of 5 V. In addition, the thickness of the barium titanate layer formed was an average of about 8 nm. The thickness of the titanium dioxide layer following anodic oxidation was about 12 nm. Electrical properties are shown in Table 1.

Moreover, instead of measuring at room temperature, the resulting capacitor sample was measured for electrostatic capacitance while continuously changing the temperature from −55° C. to +125° C. Capacitance within the range was a minimum of 2.35 µF and a maximum of 2.540. In addition, when electrostatic capacitance was measured while applying a direct current bias voltage of 1.5 V so that the electrode of the titanium foil was at a positive potential relative to the electrode comprising the laminated copper, the electrostatic capacitance was determined to be 2.50 µF. Thus, even in the case of the present example in which the titanium dioxide layer is thinner than in other examples, thereby resulting in greater susceptibility to the effects of the properties of the barium titanate layer, the dependency of capacitance on temperature and bias voltage was determined to be held to an extremely low level.

Example 3

An experiment was conducted in exactly the same manner as Example 1 with the exception of using an anodic oxidation voltage of 90 V. The thickness of the titanium dioxide layer following anodic oxidation was about 210 nm. Electrical properties are shown in Table 1.

Example 4

An experiment was conducted in exactly the same manner as Example 1 with the exception of using a 10% by weight ammonium adipate solution for the electrolyte instead of the 5% by weight phosphoric acid solution. The thickness of the titanium dioxide layer following anodic oxidation was about 150 nm. Electrical properties are shown in Table 1.

Example 5

An experiment was conducted in exactly the same manner as Example 1 with the exception of making the current density during anodic oxidation 3 $mA/cm^2$ and making the duration of anodic oxidation 60 minutes. The thickness of the titanium dioxide layer following anodic oxidation was about 140 nm. Electrical properties are shown in Table 1.

Example 6

An experiment was conducted in exactly the same manner as Example 1 with the exception of making the current density during anodic oxidation 300 $mA/cm^2$. The thickness of the titanium dioxide layer following anodic oxidation was about 140 nm. Electrical properties are shown in Table 1.

Comparative Example 1

A reaction with barium hydroxide was not carried out after rinsing with water and drying following anodic oxidation, and after carefully peeling off the masking material from the titanium foil, a sample was cut out measuring 30 mm×30 mm. An experiment was then conducted in exactly the same manner as Example 1 with the exception of forming an electrode measuring 10 mm×10 mm by laminating copper to a thickness of 200 nm by electron beam deposition on the side of the sample on which titanium dioxide was formed using a mask having an opening of 10 mm×10 mm. Electrical properties are shown in Table 1.

Example 7

An experiment was conducted in exactly the same manner as Example 1 with the exception of using a 10% choline aqueous solution instead of the 20% aqueous solution of tetramethyl ammonium hydroxide. Electrical properties are shown in Table 1.

Example 8

An experiment was conducted in exactly the same manner as Example 1 with the exception of using a 1 N sodium hydroxide aqueous solution instead of the 20% aqueous solution of tetramethyl ammonium hydroxide. Electrical properties are shown in Table 1.

Example 9

An experiment was conducted in exactly the same manner as Example 1 with the exception of using an equimolar amount of strontium hydroxide octahydrate instead of barium hydroxide octahydrate. When identified by X-ray diffraction, in addition to diffraction peaks of the titanium of the substrate and the titanium dioxide formed during anodic oxidation, since a diffraction peak was also observed for a cubic perovskite structure in the form of strontium titanate, cubic strontium titanate was determined to have been formed. Electrical properties are shown in Table 1.

Example 10

An experiment was conducted in exactly the same manner as Example 1 with the exception of further adding strontium hydroxide octahydrate in addition to the barium hydroxide octahydrate in an equimolar amount to the barium hydroxide octahydrate. When identified by X-ray diffraction, in addition to diffraction peaks of the titanium of the substrate and the titanium dioxide formed during anodic oxidation, a diffraction peak was also observed for a cubic perovskite structure. Since barium and strontium were both detected in an analysis by TEM-EDS, a perovskite structure in the form of $(Ba_x Sr_{1-x})TiO_3$ was determined to have been formed. Electrical properties are shown in Table 1.

Example 11

An experiment was conducted in exactly the same manner as Example 1 with the exception of reacting a sample rinsed with water and dried following anodic oxidation by immersing for 4 hours at 80° C. in a solution in which 5 g of barium hydroxide octahydrate were dissolved in 1 L of a 20% aqueous solution of tetramethyl ammonium hydroxide. Electrical properties are shown in Table 1.

Comparative Example 2

An experiment was conducted in exactly the same manner as Example 1 with the exception of reacting a sample rinsed with water and dried following anodic oxidation by immersing for 4 hours in a solution in which 10 g of barium hydroxide octahydrate were dissolved in 1 L of a 20% aqueous solution of tetramethyl ammonium hydroxide in an autoclave maintained at 200° C. When the autoclave was opened 4 hours later, formation of trimethyl ammonium, which is a decomposition product of tetramethyl ammonium hydroxide, was confirmed. When identified by X-ray diffraction, in addition to diffraction peaks of the titanium of the substrate and the titanium dioxide formed during anodic oxidation, a diffraction peak was extremely weakly observed for a cubic perovskite structure in the form of barium titanate. On the basis of this finding, it is thought that under these conditions, decomposition of tetramethyl ammonium hydroxide proceeded thereby preventing hardly any occurrence of the reaction between titanium dioxide and barium ions. When a cross-section was observed with a TEM, cubic barium titanate was sporadically dispersed in the titanium dioxide in the form of particles and did not form a layer.

Comparative Example 3

An experiment was conducted in exactly the same manner as Comparative Example 2 with the exception of using a 1 N sodium hydroxide aqueous solution instead of the 20% aqueous solution of tetramethyl ammonium hydroxide. When identified by X-ray diffraction, although diffraction peaks were observed for the titanium of the substrate and a cubic perovskite structure in the form of barium titanate, a diffraction peak was not observed for titanium dioxide formed during anodic oxidation. On the basis of this finding, it is thought that nearly all of the titanium dioxide reacted with barium ions resulting in the formation of cubic barium titanate. Although a capacitor was produced from this sample in the same manner as Example 1, it ended up shorting and the electrical properties thereof were unable to be measured.

Comparative Example 4

A foil was obtained by etching titanium foil having a thickness of 50 μm and purity of 99.9% (Thank Metal Co., Ltd.) with hydrofluoric acid to a thickness of 40 for use as a substrate. A masking material was coated onto one side of the resulting foil. An experiment was then conducted in exactly the same manner as Example 1 with the exception of not carrying out anodic oxidation on this sample and allowing to react by immersing for 4 hours at 80° C. in a solution in which 10 g of barium hydroxide octahydrate were dissolved in a 20% aqueous solution of tetramethyl ammonium hydroxide. When identified by X-ray diffraction, in addition to a diffraction peak of the titanium of the substrate, a diffraction peak was extremely weakly observed for a cubic perovskite structure in the form of barium titanate. The resulting capacitor ended up shorting and electrical properties were unable to be measured. This is thought to be the result of not having formed a titanium dioxide layer.

Comparative Example 5

An experiment was conducted in exactly the same manner as Comparative Example 4 with the exception of using a 1 N sodium hydroxide aqueous solution instead of the 20% aqueous solution of tetramethyl ammonium hydroxide and immersing for 4 hours in an autoclave maintained at 200° C. When identified by X-ray diffraction, in addition to a diffraction peak of the titanium of the substrate, a diffraction peak was weakly observed (although observed more strongly than Comparative Example 4) for a cubic perovskite structure in the form of barium titanate. The resulting capacitor ended up shorting and electrical properties were unable to be measured.

A portion of the titanium foil was immersed in a 5% by weight aqueous phosphoric acid solution without peeling off the masking material from the sample reacted in an autoclave using the same procedure. Electrical properties were then measured using the titanium substrate as a positive electrode and platinum foil immersed in the same solution so as not to contact the sample as a negative electrode. The surface area of the sample immersed in 5% by weight aqueous phosphoric acid solution was 112 mm². Electrostatic capacitance at this time at 1 kHz was 178 nf, and tan δ was 0.056. The reason electrical properties of the sample that were unable to be measured at the copper electrode were able to be measured in the electrolyte is thought to be due to oxidation (repair) of current leakage in the electrolyte.

Example 12

The Model SPF-332H manufactured by Nichiden Anelva Co. was used for the sputtering apparatus. Sputtering targets in the form of titanium dioxide having a rutile crystal structure fabricated to a diameter of 76 mm and thickness of 5 mm, and barium titanate having a perovskite crystal structure similarly fabricated to a diameter of 76 mm and thickness of 5 mm, were placed in the sputtering apparatus. A substrate in the form of a platinum foil measuring 15 mm×15 mm and having a thickness of 50 μm was placed in the sputtering apparatus so that the distance between the platinum foil and the targets was 50 mm. The pressure was then reduced to $2 \times 10^{-4}$ Pa without heating the substrate. Subsequently, after introducing oxygen into the sputtering apparatus to a pressure of $1 \times 10^{-2}$ Pa, argon was introduced to a pressure of $2 \times 10^{-1}$ Pa. An RF power supply was set to 200 W and a titanium dioxide film was first formed on the substrate to a thickness of 140 nm by sputtering the titanium dioxide target. Continuing, sputtering was carried out at an RF output of 200 W using barium titanate for the sputtering target while maintaining the same atmosphere to form a barium titanate film on the titanium dioxide film at a thickness of 20 nm. The substrate was then taken out of the sputtering apparatus and copper was deposited thereon at a thickness of 200 nm using a mask having an opening measuring 10 mm×10 mm for use as one of the electrodes. Electrical properties were then measured in the same manner as Example 1 using the platinum foil of the substrate for the other electrode. Electrical properties are shown in Table 1.

Example 13

An experiment was conducted in exactly the same manner as Example 12 with the exception of first forming a barium titanate layer having a thickness of 20 nm on the platinum foil by RF sputtering followed by forming a titanium dioxide layer thereon at a thickness of 140 nm. Electrical properties are shown in Table 1.

Example 14

An experiment was conducted in exactly the same manner as Example 12 with the exception of first forming a barium titanate layer having a thickness of 20 nm on the platinum foil by RF sputtering followed by forming a titanium dioxide layer thereon at a thickness of 140 nm, and further forming a barium titanate layer having a thickness of 20 nm on the titanium dioxide layer by RF sputtering. Electrical properties are shown in Table 1.

Example 15

An experiment was conducted in exactly the same manner as Example 1 with the exception of using calcium hydroxide instead of barium hydroxide octahydrate. When identified by X-ray diffraction, in addition to diffraction peaks of the titanium of the substrate and the titanium dioxide formed during anodic oxidation, since a diffraction peak was also observed for a cubic perovskite structure in the form of calcium titanate, cubic calcium titanate was determined to have been formed. Electrical properties are shown in Table 1.

TABLE 1

|  | Capacitance density (F/cm2) | tanδ | Direct current resistance (Ω) | Dielectric breakdown voltage (V) | Capacitance density × dielectric breakdown voltage (F · V/cm2) | C(1 MHz)/ C(100 Hz)(%) |
|---|---|---|---|---|---|---|
| Example 1 | $2.12 \times 10^{-7}$ | 0.003 | $1.4 \times 10^9$ | 6.4 | $1.26 \times 10^{-6}$ | 92.1 |
| Example 2 | $2.50 \times 10^{-6}$ | 0.009 | $1.1 \times 10^9$ | 2.0 | $5.0 \times 10^{-6}$ | 80.4 |
| Example 3 | $1.41 \times 10^{-7}$ | 0.002 | $1.9 \times 10^9$ | 9.5 | $1.24 \times 10^{-6}$ | 95.0 |
| Example 4 | $2.15 \times 10^{-7}$ | 0.004 | $1.0 \times 10^9$ | 6.5 | $1.40 \times 10^{-6}$ | 91.4 |
| Example 5 | $2.13 \times 10^{-7}$ | 0.003 | $1.3 \times 10^9$ | 6.0 | $1.28 \times 10^{-6}$ | 91.2 |
| Example 6 | $2.25 \times 10^{-7}$ | 0.007 | $8.8 \times 10^8$ | 5.1 | $1.15 \times 10^{-6}$ | 90.2 |
| Comp. Ex. 1 | $1.98 \times 10^{-7}$ | 0.008 | $7.3 \times 10^8$ | 1.4 | $2.77 \times 10^{-7}$ | 94.7 |
| Example 7 | $2.10 \times 10^{-7}$ | 0.004 | $1.4 \times 10^9$ | 6.0 | $1.26 \times 10^{-6}$ | 91.6 |
| Example 8 | $2.54 \times 10^{-7}$ | 0.016 | $2.3 \times 10^8$ | 6.5 | $1.65 \times 10^{-6}$ | 86.3 |
| Example 9 | $1.98 \times 10^{-7}$ | 0.002 | $8.9 \times 10^8$ | 7.0 | $1.39 \times 10^{-6}$ | 97.0 |
| Example 10 | $2.02 \times 10^{-7}$ | 0.005 | $8.6 \times 10^8$ | 5.8 | $1.17 \times 10^{-6}$ | 90.5 |
| Example 11 | $2.06 \times 10^{-7}$ | 0.005 | $8.1 \times 10^8$ | 3.3 | $6.80 \times 10^{-7}$ | 92.0 |
| Comp. Ex. 2 | $2.22 \times 10^{-7}$ | 0.012 | $6.7 \times 10^7$ | 1.2 | $2.66 \times 10^{-7}$ | 71.3 |
| Comp. Ex. 3 | — | — | — | — | — | — |
| Comp. Ex. 4 | — | — | — | — | — | — |
| Comp. Ex. 5 | — | — | — | — | — | — |
| Example 12 | $4.40 \times 10^{-8}$ | 0.002 | $2.3 \times 10^9$ | 8.8 | $3.87 \times 10^{-7}$ | 93.7 |
| Example 13 | $4.30 \times 10^{-8}$ | 0.002 | $2.6 \times 10^9$ | 7.7 | $3.31 \times 10^{-7}$ | 94.1 |
| Example 14 | $3.98 \times 10^{-8}$ | 0.001 | $3.9 \times 10^9$ | 10.2 | $4.05 \times 10^{-7}$ | 90.5 |
| Example 15 | $1.88 \times 10^{-7}$ | 0.002 | $1.3 \times 10^9$ | 6.8 | $1.28 \times 10^{-6}$ | 96.8 |

INDUSTRIAL APPLICABILITY

According to the present invention, by laminating a titanium dioxide layer and a titanate compound layer having perovskite crystals, a material can be obtained having high withstand voltage and low leakage current, either of which is unable to be obtained with a single layer. This material is preferable for use in electronic components such as a capacitor, and makes it possible to reduce the size of electronic components as well as reduce the size and weight of electronic devices containing the electronic components.

The invention claimed is:

1. A capacitor material comprising: lamination of a titanium dioxide layer and a titanate compound layer having perovskite crystals,
wherein
the titanate compound layer having perovskite crystals is laminated by reacting an aqueous solution of pH 11 or higher containing at least one type of metal ion selected from the group consisting of Ca, Sr and Ba with the titanium dioxide layer at a temperature range of 80° C. to the boiling point.

2. The capacitor material according to claim 1, wherein an insulating material layer is further laminated on the titanium dioxide layer or the titanate compound layer.

3. The capacitor material according to claim 1, wherein the titanate compound is a compound with at least one type of element selected from the group consisting of Ca, Sr and Ba.

4. The capacitor material according to claim 1, wherein the titanium dioxide layer and the titanate compound layer are laminated on a substrate.

5. A capacitor comprising: arranging the titanium dioxide layer and the titanate compound layer of the capacitor material according to claim 1 so as to be electrically in series between a pair of electrodes.

6. The capacitor material according to claim 2, wherein the insulating material is titanium dioxide or a titanate compound having perovskite crystals.

7. The capacitor material according to claim 4, wherein the substrate is an electrode.

8. The capacitor material according to claim 4, wherein the substrate is titanium or an alloy containing titanium.

9. The capacitor material according to claim 4, wherein the substrate is a foil.

10. The capacitor material according to claim 4, wherein the substrate is a sintered body of titanium or an alloy containing titanium.

11. The capacitor according to claim 5, wherein the product of capacitance density and dielectric breakdown voltage at a measuring frequency of 1 MHz is 300 nF·V/cm$^2$ or more.

12. The capacitor according to claim 5, wherein the dielectric loss tangent at a measuring frequency of 1 kHz is 0.03 or less.

13. The capacitor according to claim 5, wherein the electrostatic capacitance at a measuring frequency of 1 MHz is 80% or more of the electrostatic capacitance at a measuring frequency of 100 Hz.

14. A wiring board containing the capacitor according to claim 5.

15. An electronic device containing the capacitor according to claim 5.

16. The capacitor material according to claim 9, wherein the thickness of the foil is 5 to 300 μm.

17. The capacitor material according to claim 10, wherein the sintered body is a sintered body of particles having a particle diameter of 0.1 to 20 μm.

18. A production method of a capacitor material comprising: a step for laminating a titanium dioxide layer and a titanate compound layer having perovskite crystals,
wherein
the titanate compound layer having perovskite crystals is laminated by reacting an aqueous solution of pH 11 or higher containing at least one type of metal ion selected from the group consisting of Ca, Sr and Ba with the titanium dioxide layer at a temperature range of 80° C. to the boiling point.

19. The production method of a capacitor material according to claim 18, wherein the lamination is carried out on a substrate.

20. The production method of a capacitor material according claim 18, comprising a step for drying the capacitor material following the reaction, and the aqueous solution containing at least one type of metal ion selected from the group consisting of Ca, Sr and Ba is vaporized by at least one means from among evaporation, sublimation and thermal decomposition at a temperature equal to or lower than the drying temperature and under atmospheric pressure or reduced pressure.

21. The production method of a capacitor material according to claim 18, further having a step for laminating an insulating material layer on the titanium dioxide layer or the titanate compound layer.

22. A capacitor production method having a step for producing a capacitor material using the production method according to claim 18, and a step for forming a pair of electrodes so as to be electrically in series with respect to the titanium dioxide layer and titanate compound layer of the capacitor material.

23. The production method of a capacitor material according to claim 19, wherein the substrate is titanium or a metal containing titanium, and the titanium dioxide layer is formed by anodizing the substrate.

24. A capacitor production method having a step for producing a capacitor material using the production method according to claim 13, and a step for using the substrate of the capacitor material as one electrode and further laminating a counter electrode layer during lamination of the capacitor material.

25. The production method of a capacitor material according to claim 21, wherein the insulating material is titanium dioxide or a titanate compound having perovskite crystals.

26. The production method of a capacitor material according to claim 23, wherein the substrate is anodized after removing a natural oxidization coating from the substrate surface.

* * * * *